United States Patent
Aderhold

(10) Patent No.: US 12,390,843 B2
(45) Date of Patent: Aug. 19, 2025

(54) RAPID THERMAL PROCESSING (RTP) CHAMBER OUTGASSING REMOVAL

(71) Applicant: Applied Materials, Inc., Santa Clara, CA (US)

(72) Inventor: Wolfgang Aderhold, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/238,891

(22) Filed: Aug. 28, 2023

(65) Prior Publication Data

US 2024/0123477 A1    Apr. 18, 2024

Related U.S. Application Data

(60) Provisional application No. 63/415,817, filed on Oct. 13, 2022.

(51) Int. Cl.
*B08B 13/00* (2006.01)
*B08B 5/00* (2006.01)
*H01L 21/67* (2006.01)

(52) U.S. Cl.
CPC .............. *B08B 13/00* (2013.01); *B08B 5/00* (2013.01); *H01L 21/67115* (2013.01)

(58) Field of Classification Search
None
See application file for complete search history.

(56) References Cited

U.S. PATENT DOCUMENTS

| | | |
|---|---|---|
| 2007/0095799 A1 | 5/2007 | Matsuzawa et al. |
| 2007/0134821 A1 | 6/2007 | Thakur et al. |
| 2010/0076729 A1* | 3/2010 | Davis ............... H01L 21/67276 702/184 |
| 2012/0183915 A1 | 7/2012 | Merry et al. |
| 2020/0226742 A1* | 7/2020 | Sawlani ........... H01L 21/67288 |

FOREIGN PATENT DOCUMENTS

| | | |
|---|---|---|
| KR | 10-0777570 B1 | 11/2007 |
| KR | 100777570 | * 11/2007 |

OTHER PUBLICATIONS

International Search Report and Written Opinion from PCT/US2023/032925 mailed Jan. 8, 2024, 12 pgs.
International Preliminary Report on Patentability for International Application No. PCT/US2023/032925 dated Apr. 24, 2025, 9 pgs.

* cited by examiner

*Primary Examiner* — Raymond L Nimox
(74) *Attorney, Agent, or Firm* — Schwabe, Williamson & Wyatt, P.C.

(57) ABSTRACT

Embodiments disclosed herein include a method of monitoring a condition of a chamber. In an embodiment, the method comprises processing a substrate in the chamber, providing substrate history and chamber data to a model of the chamber, where the model of the chamber is configured to predict a chamber cleanliness, comparing the predicted chamber cleanliness against a performance limit, and flagging the chamber for preventive maintenance (PM) when the predicted chamber cleanliness is above the performance limit.

12 Claims, 8 Drawing Sheets

RAPID THERMAL PROCESSING (RTP) CHAMBER OUTGASSING REMOVAL

CROSS-REFERENCE TO RELATED APPLICATIONS

This application claims the benefit of U.S. Provisional Application No. 63/415,817, filed on Oct. 13, 2022, the entire contents of which are hereby incorporated by reference herein.

BACKGROUND

1) Field

Embodiments relate to the field of semiconductor manufacturing and, in particular, to a rapid thermal processing (RTP) chamber with one or more algorithms to identify when preventative maintenance (PM) is needed and when to clean the RTP chamber.

2) Description of Related Art

Material outgassing in semiconductor processing chambers can lead to deposits on the interior surface of a chamber. In the case of a rapid thermal processing (RTP) tool, cold-wall surfaces are particularly prone to picking up deposits. For example, temperature sensor (e.g., pyrometers) mis-readings due to surface contamination can result in negative impacts to process control and can lead to yield issues. That is, the temperature sensor may not read the true temperature of a surface, and feedback loops to control the voltage supplied to lamps in the RTP tool may operate on the incorrect information. This can result in temperatures of the RTP tool being too high in some instances.

Accordingly, it is necessary to clean the RTP tool at regular intervals or when yield issues are discovered. The current cleaning solution relies on daily test wafer monitoring in order to trigger a tool down for preventative maintenance (PM). The cleaning may include a manual wet clean. This requires the chamber to be opened and retuned after cleaning. Further, a requalification of the process is also needed. To remove trace metals after chamber integrity is broken may require thousands of seasoning wafers to be run.

SUMMARY

Embodiments disclosed herein include a method of monitoring a condition of a chamber. In an embodiment, the method comprises processing a substrate in the chamber, providing substrate history and chamber data to a model of the chamber, where the model of the chamber is configured to predict a chamber cleanliness, comparing the predicted chamber cleanliness against a performance limit, and flagging the chamber for preventive maintenance (PM) when the predicted chamber cleanliness is above the performance limit.

Embodiments may also include a method of cleaning a chamber. The method may comprise providing substrate history and chamber data to a model of the chamber, where the model of the chamber is configured to predict a chamber cleanliness, comparing the predicted chamber cleanliness against a performance limit, and cleaning the chamber when the predicted chamber cleanliness does not pass the performance limit.

Embodiments may also include a rapid thermal processing (RTP) tool. In an embodiment, the RTP tool comprises a chamber, a reflector plate, a substrate support, an edge ring around the substrate support, a plurality of lamps above the reflector plate, and a model of the tool. In an embodiment, the model of the tool is configured to predict a chamber cleanliness by comparing the predicted chamber cleanliness against a performance limit, and flag the chamber for preventive maintenance (PM) when the predicted chamber cleanliness is above the performance limit.

DETAILED DESCRIPTION

Systems described herein include a rapid thermal processing (RTP) chamber with one or more algorithms to identify when preventative maintenance (PM) is needed and when to clean the RTP chamber. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, deposits on interior surfaces of a chamber negatively impact the process performance. This can lead to yield issues, and requires frequent cleaning. The cleaning may include opening the chamber and implementing a manual wet clean. This takes time and expertise. Additionally, subsequent to the cleaning, the chamber needs to be retuned and the process needs to be requalified.

Accordingly, embodiments disclosed herein include a chamber monitoring and cleaning process that is automated. The state of the chamber, (i.e., the cleanliness of the chamber) can be monitored with one or more algorithms that map the state of the interior surfaces. When the surface coatings pass a threshold level that negatively impacts the process performance, a warning is triggered. The warning can then be used to initiate a self-cleaning operation. In a particular embodiment, the self-cleaning operation is a waferless clean process. That is, the cleaning is implemented without a wafer present in the chamber. The algorithm can also be used in order to monitor the clean, and can provide an indication when the cleaning is completed. Accordingly, the cleaning process can be implemented without opening the chamber. Therefore, tuning and requalification processes can be reduced in duration or omitted.

Figure 1:
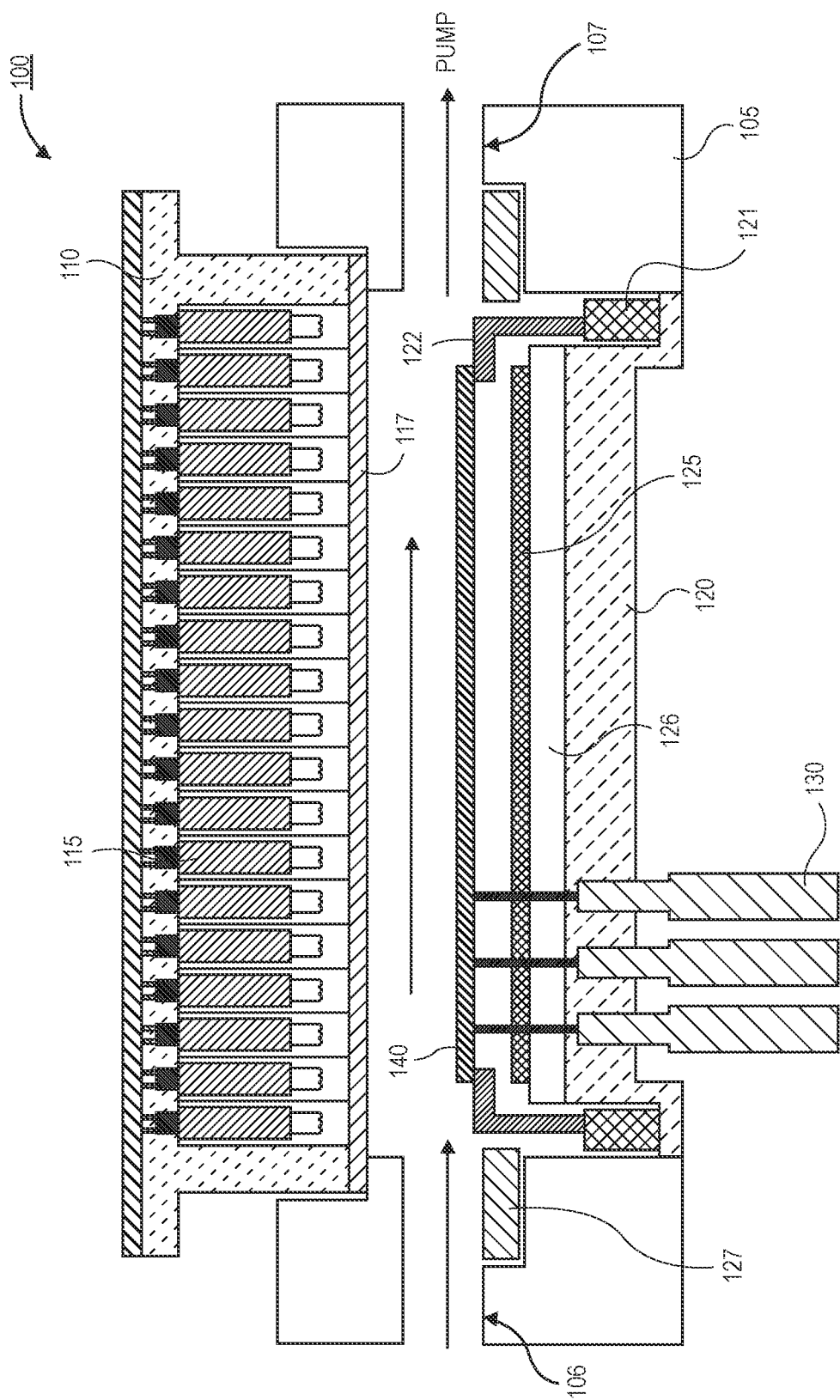
FIG. 1 is a cross-sectional illustration of a rapid thermal processing (RTP) tool, in accordance with an embodiment.

Referring now to FIG. 1, a cross-sectional illustration of a semiconductor processing tool 100 is shown, in accordance with an embodiment. In an embodiment, the semiconductor processing tool 100 may be a RTP tool. That is, the semiconductor processing tool 100 may be configured to rapidly heat a substrate 140 in order to modify a surface of the substrate 140. For example, a rapid thermal oxidation process may be implemented on the substrate 140.

In an embodiment, the substrate 140 may be a semiconductor substrate. For example, the substrate 140 may be a silicon wafer or the like. The substrate 140 may have any standard wafer form factor (e.g., 150 mm, 200 mm, 300 mm, 450 mm, etc.). Additionally, the substrate 140 may have other form factors besides round shapes in some embodiments.

In an embodiment, the semiconductor processing tool 100 may comprise a chamber 105. The chamber 105 may be any suitable material, such as stainless steel or the like. An interior surface of the chamber 105 may have a coating in some embodiments to protect the surfaces of the chamber 105.

In an embodiment, the semiconductor processing tool 100 may have a substrate support structure. The substrate support structure may include a base 120. An insert 126 may be provided over the base 120. In an embodiment, a reflector 125 may be provided over the insert 126. The reflector 125 may be used to reflect radiation back to the substrate 140 in order to improve heating of the substrate 140. The reflector 125 may be any reflective material. The support structure may further comprise a substrate support 122. The substrate support 122 may support the substrate 140 over the reflector 125. There may be a space provided between the reflector 125 and the substrate 140. In an embodiment, the substrate support 122 may be coupled to a lift mechanism 121 to raise or lower the substrate 140. In an embodiment, an edge ring 127 may be provided around the perimeter of the substrate support 122 and the substrate 140.

In an embodiment, a fluidic path may be provided through the chamber 105. As indicated by the arrows, a gas may flow into the chamber 105 through opening 106, pass over the substrate 140, and exit the chamber 105 through an exit 107. The exit 107 may be coupled to a pump (not shown). The pump may be used to evacuate species from the chamber 105.

In an embodiment, a lamp housing 110 may be provided over the substrate 140. The lamp housing 110 may include a plurality of lamps 115. The lamps 115 may be distributed across a surface of the substrate 140. The lamps 115 may be individually controllable in order to provide a desired heating profile over the substrate 140. In an embodiment, any suitable lamp architecture may be used. The lamps 140 may be separated from the main chamber volume by a window 117. For example, the window 117 may be a quartz window 117 or the like. As such, thermal energy from the lamps 140 passes through the window 117 to reach the substrate 140. Thermal energy that passes through the substrate 140 may be reflected back to the substrate 140 by the reflector 125.

In an embodiment, one or more sensors may be provided in the semiconductor processing tool 100 in order to provide feedback control to the lamps 115. For example, one or more pyrometers 130 may be included in the chamber 105. The pyrometers 130 may pass through the base 120 and detect the temperature of the backside of the substrate 140. The pyrometers 130 may be distributed across the back of the substrate 140 in order to provide spatial temperature measurements.

In an embodiment, the interior surfaces of the chamber 105 (e.g., chamber sidewalls, the reflector 125, the edge ring 127, and the like) may be coated during use of the semiconductor processing tool 100. For example, outgassing species from the substrate 140 may deposit on the surfaces. The deposition may be further enhanced due to some of the surfaces being considered cold-wall surfaces. That is, some of the surfaces may be actively cooled. Deposition of layers on the interior surfaces of the semiconductor processing tool 100 may negatively affect processing performance and device yield. For example, as coatings are applied over the pyrometers 130, the measured temperatures may be offset from the real temperature of the system. This can lead to improper feedback to the voltage control of the lamps 115, which can result in temperature overshoots.

Figure 2A:
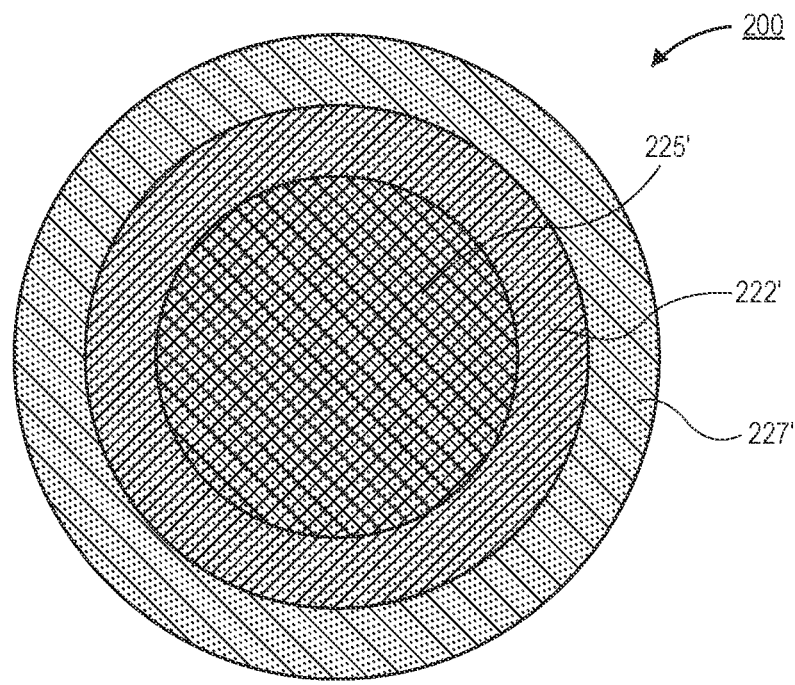
FIG. 2A is a plan view illustration of a dirty RTP tool looking down at the reflector and the edge ring, in accordance with an embodiment.
Figure 2B:
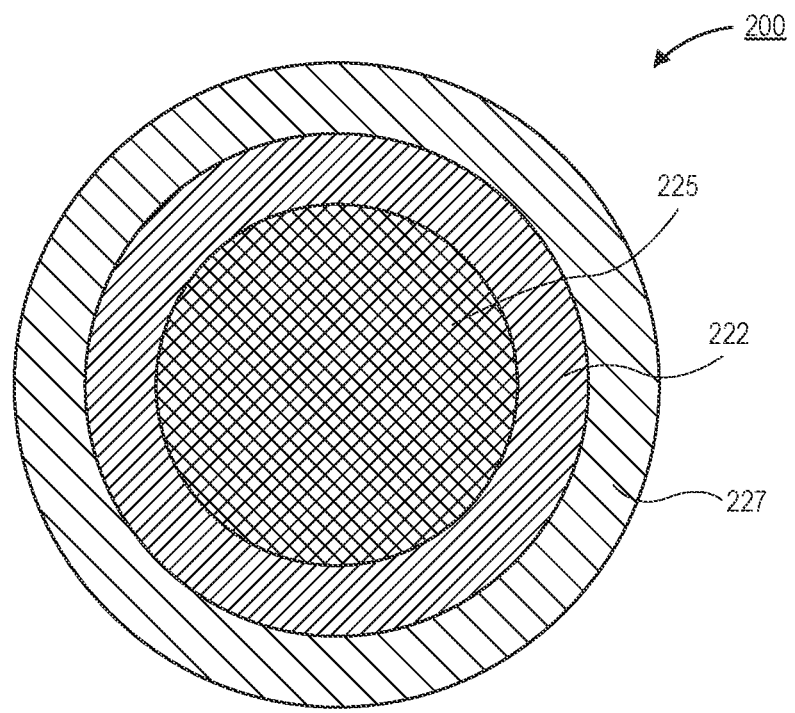
FIG. 2B is a plan view illustration of a clean RTP tool looking down at the reflector and the edge ring, in accordance with an embodiment.

Referring now to FIG. 2A and FIG. 2B, plan view illustrations of the interior of a semiconductor processing tool 200 are shown, in accordance with an embodiment. In FIG. 2A, a coating is provided over the reflector 225, the substrate support 222, and the edge ring 227. The coated surfaces are indicated as 225', 222', and 227' in order to indicate that they have a coating over the surfaces. The coating may be carbon based coating. For example, as will be described in greater detail below, a carbon may outgas from the surface of the substrate and redeposit on the interior surfaces of the chamber. Referring now to FIG. 2B, a plan view illustration of a clean semiconductor processing tool 200 is shown, in accordance with an embodiment. As shown, the reflector 225, the substrate support 222, and the edge ring 227 are clean without the carbon coating.

Figure 3A:
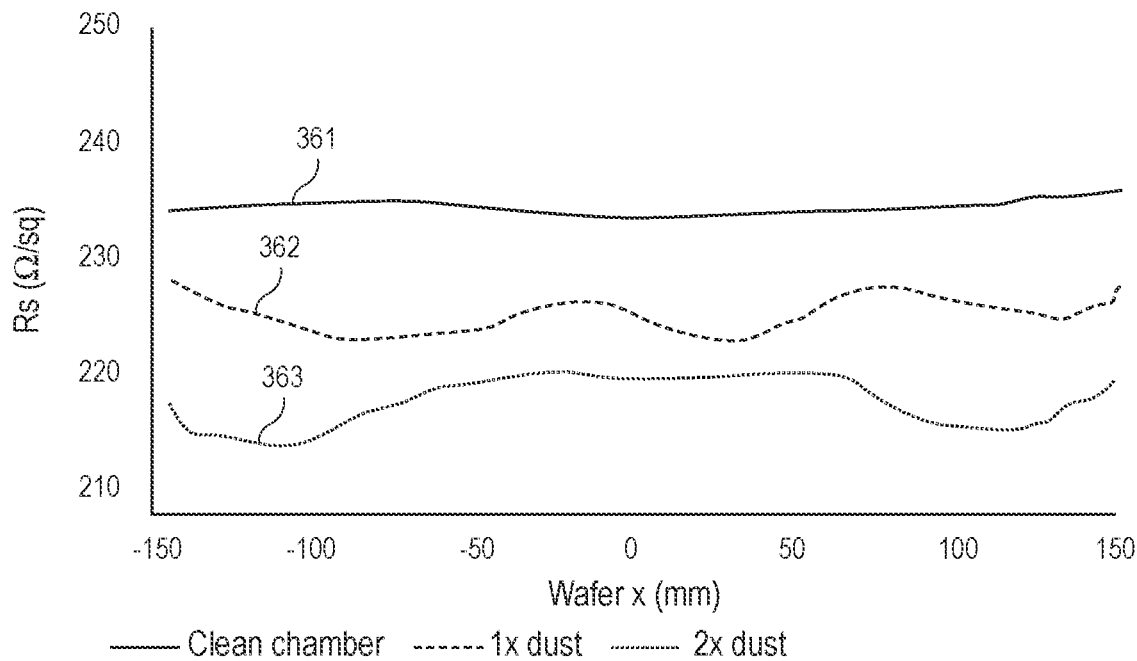
FIG. 3A is a graph of the sheet resistance of substrates processed in a clean chamber, a chamber with a first level of coating, and a chamber with a second level of coating, in accordance with an embodiment.

Referring now to FIG. 3A, a graph of the sheet resistance of various substrates is shown, in accordance with an embodiment. The first line 361 is a graph of the sheet resistance across the surface of a substrate when the chamber used is clean. The second line 362 is a graph of the sheet resistance across the surface of a substrate when the chamber has a first level of coating over the interior surface of the chamber. The third line 362 is a graph of the sheet resistance across the surface of a substrate when the chamber has a second level of coating over the interior surface of the chamber. The thickness of the second level of coating is greater than the thickness of the first level of coating. As shown, the sheet resistance decreases as a result of increased chamber coatings.

In the embodiment shown in FIG. 3A, the chamber coatings are provided through a controlled outgassing process. For the first level of coating, a substrate comprising an amorphous carbon film is provided in the chamber for a first duration at an elevated temperature (e.g., 500 degrees Celsius) in order to outgas carbon onto the interior surfaces. For the second level of coating a pair of substrates with an amorphous carbon film are outgassed into the chamber. As used herein the first level of coating may be referred to as a first dusting, and the second level of coating may be referred to as undergoing two dusting processes.

Figure 3B:
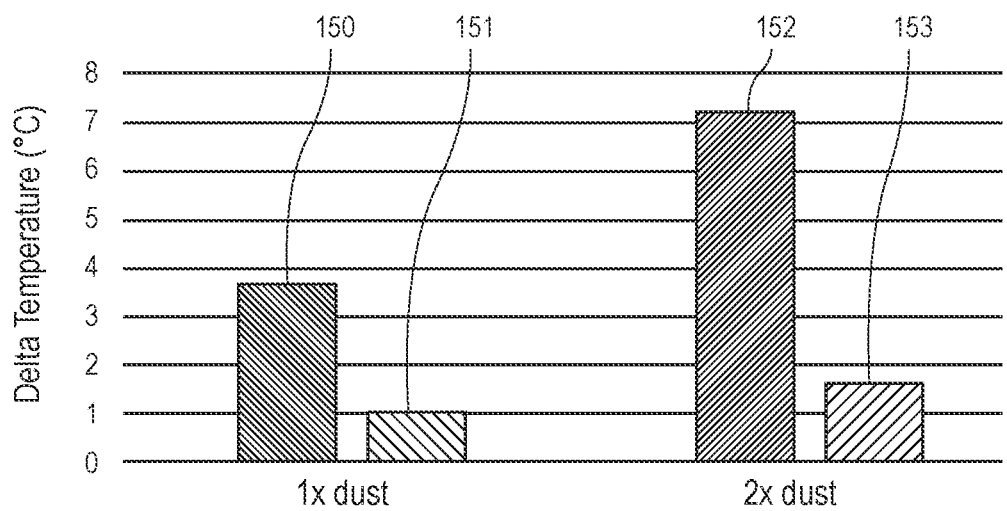
FIG. 3B is a graph of the resulting temperature variation and standard deviation for an RTP tool with a first level of a coating and a second level of the coating, in accordance with an embodiment.

Referring now to FIG. 3B, a graph of the change in temperature for the first dusting (left) and the pair of dustings (right) is shown. As indicated by bar 150, the first dusting results in an average increase in temperature that is about 3.5 degrees Celsius with a standard deviation 151 of approximately 1 degree Celsius. The pair of dustings result in a temperature increase 152 that is approximately 7 degrees Celsius with a standard deviation 153 of approximately 1.5 degrees Celsius. Accordingly, the presence of carbon films over the interior surfaces of the chamber significantly alters the outcome of the processing operation.

Figure 4A:
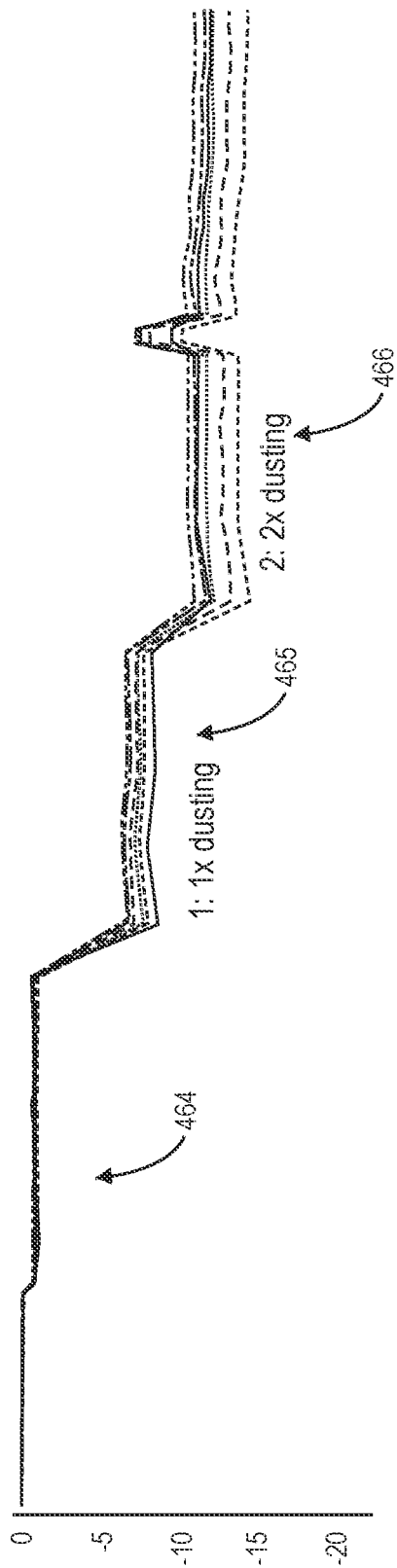
FIG. 4A is a graph of wafer to wafer modeling of an RTP tool with a first level of a coating and a second level of the coating, in accordance with an embodiment.

Referring now to FIG. 4A, a graph of a model of a semiconductor processing performance is shown, in accordance with an embodiment. The model may be an artificial intelligence (AI) or machine learning (ML) model of the state of the chamber. The model may represent the expected outcomes of wafers that are processed in the chamber. That is, the graph in FIG. 4A may be modeled data, and real wafers do not need to be processed in order to generate the graph shown in FIG. 4A.

The X-axis is the number of the wafer that is being process. For example, a first set of wafers are processed in region 464. Region 464 indicates a clean chamber. In region 465 a first dusting is done. As shown, the values in the first dusting region 465 the values are generally decreased to between −5 and −10. Region 466 is after a second dusting is done in the chamber. As shown, the second dusting region 466 has decreased values between −10 and −15.

Figure 4B:
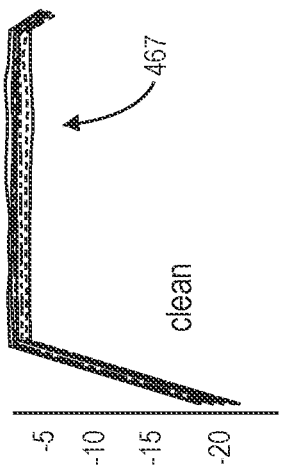
FIG. 4B is a graph of wafer to wafer modeling of an RTP tool after a cleaning process, in accordance with an embodiment.

Referring now to FIG. 4B, a model is shown with a graph of wafer outcomes after a clean is implemented in the chamber. As shown, the values of region 467 return to about the same state shown in region 464 (i.e., a clean chamber). As such, it can be expected that subsequent to the cleaning operation, the performance of the chamber is reset back to within specification. In an embodiment, the cleaning operation may be any suitable cleaning process, depending on the specific coating provided by the dusting. In some embodiments, the cleaning process may be a waferless cleaning process. That is, the cleaning process is executed without a substrate or wafer in the chamber.

Figure 5A:
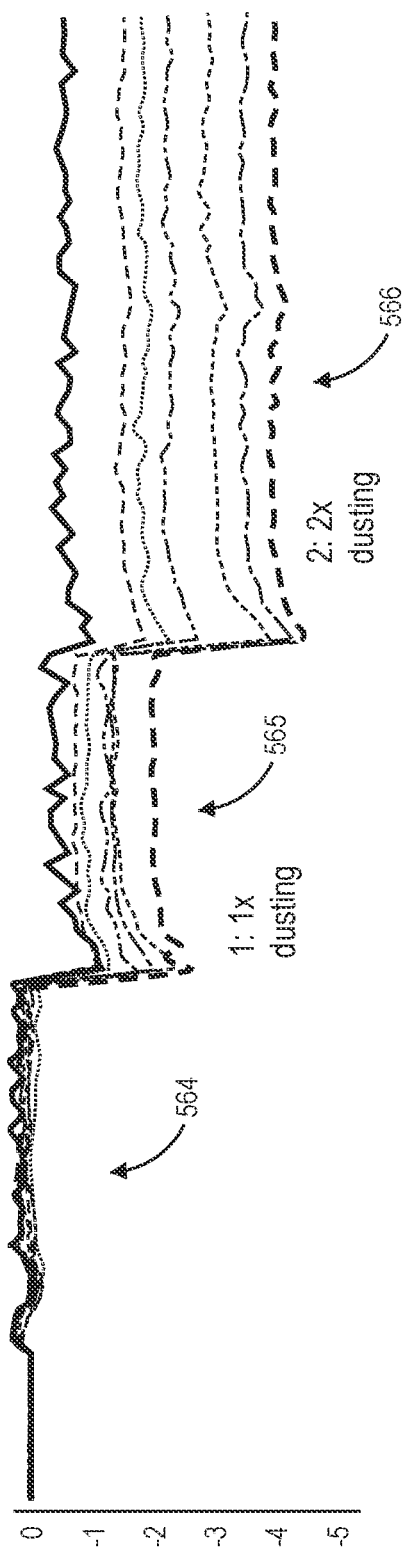
FIG. 5A is a graph of wafer to wafer radiation sensor data for an RTP tool with a first level of a coating and a second level of the coating, in accordance with an embodiment.

Referring now to FIG. 5A, a graph of the wafer-to-wafer performance of a chamber is shown, in accordance with an embodiment. The data supplied in FIG. 5A may be actual sensor data from a plurality of substrates that are processed in a chamber. For example, the data may be from one or more pyrometers in some embodiments. In region 564, the substrates are processed in a substantially clean chamber. In region 565, the substrates are processed in a chamber that has undergone a first dusting. In region 566, the substrate are processed in a chamber that has undergone a second dusting. The data shown in FIG. 5A substantially lines up with the model data shown in FIG. 4A. That is, the modeling process accurately matches the actual results of the processing in the chamber. A more detailed description of the model will be provided in greater detail below.

Figure 5B:
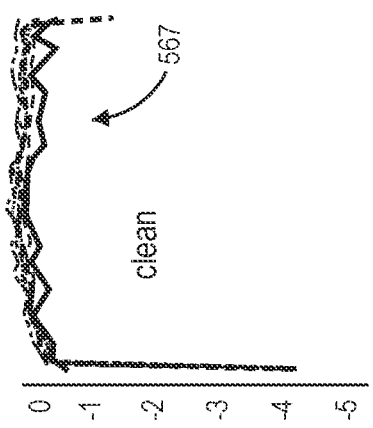
FIG. 5B is a graph of wafer to wafer radiation sensor data for an RTP tool after a cleaning process, in accordance with an embodiment.

As shown in FIG. 5B, region 567 is a measurement of the performance after a chamber clean. Similar to FIG. 4B, the chamber clean resets the performance so that it is similar to region 564 of a clean chamber. The cleaning process may be any cleaning process that is used in order to clean a specific type of coating. In an embodiment, the chamber cleaning process may be a waferless cleaning process.

Figure 6:
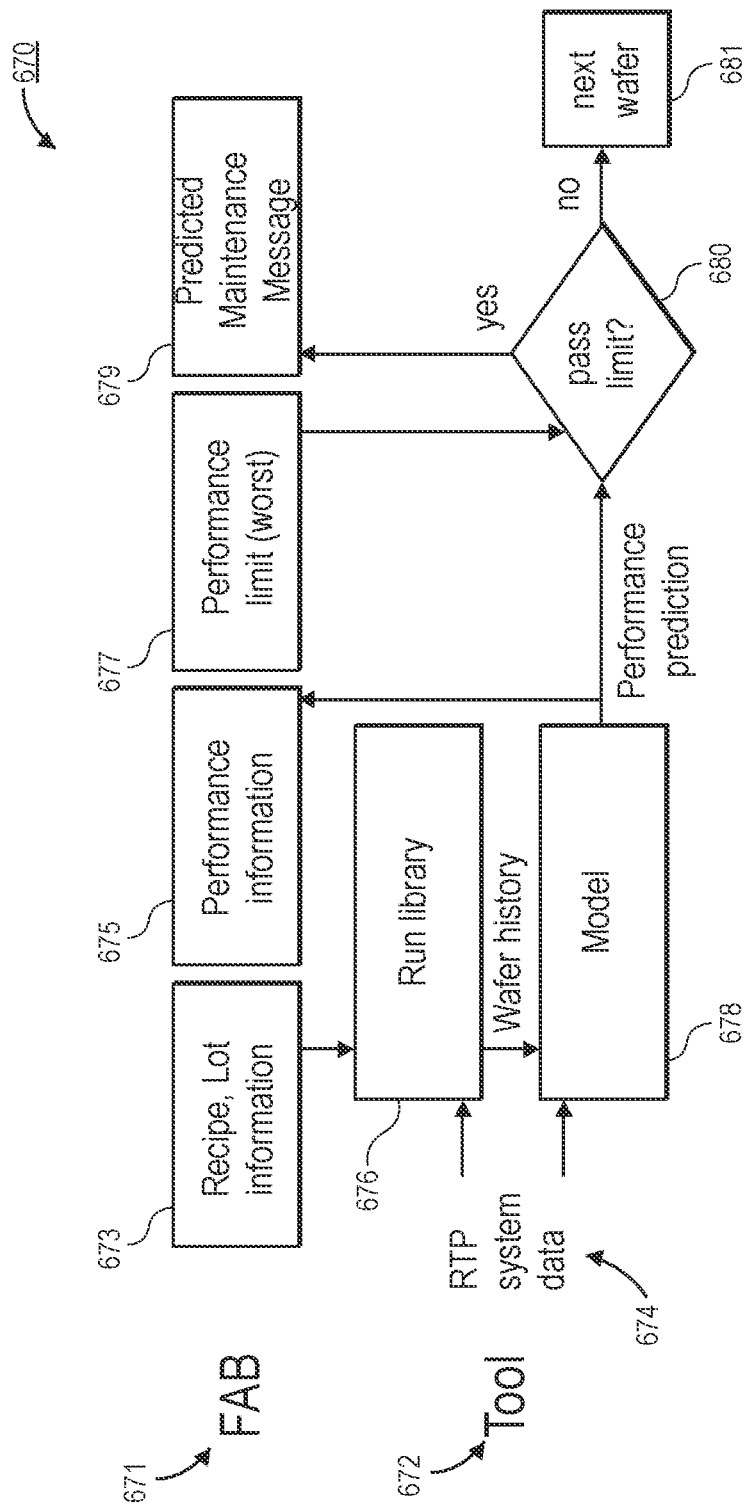
FIG. 6 is a process flow diagram of a process for identifying when a preventive maintenance (PM) operation on an RTP tool is needed, in accordance with an embodiment.

Referring now to FIG. 6, a process flow diagram of a process 670 for monitoring the cleanliness of a chamber is shown, in accordance with an embodiment. In an embodiment, the process may be implemented on fabrication facility (FAB) computers 671 and directly on the tool 672. In other embodiments, the entire process 670 may be executed locally on the tool 672. The tool 672 may be a RTP tool 672 in some embodiments. In an embodiment, the recipe and/or lot information 673 may be supplied to the tool 672. The recipe and/or lot information 673 may inform a run library 676. The run library 676 may include the substrate history (e.g., the processes implemented on the substrates, the metrology performed on the substrates, and the like). The run library 676 may supply wafer history to the model 678. The run library 676 and the model 678 may also have system data 674 inputs. The system data 674 may include sensor data from the tool 672. For example, system data 674 may include a voltage value of one or more lamps in the chamber, a pyrometer reading of one or more pyrometers in the chamber, pumping data, and data from one or more witness sensors.

In an embodiment, the model 678 may be an AI or ML model. Data obtained from one or more sensors within the tool 672 may be used to inform the model 678. The model 678 may map a condition of the chamber. For example, the model may determine a state of cleanliness of the chamber. In a particular embodiment, a graph similar to the graph in FIG. 4A may be generated by the model in order to predict performance of the processing of substrates in the tool 672. In an embodiment, the model 678 may be considered a digital twin of the tool 672. As a digital twin, the model 678 uses inputs such as system data 674, physics based equations to model the physics of the tool, and the like in order to accurately map the performance of the tool 672.

In an embodiment, the model 678 may output a performance prediction. The performance prediction may be an estimated wafer outcome from implementing a process in the chamber, such as an oxidation process. In an embodiment, the performance prediction may be sent to a performance information block 675 in the FAB 671. Additionally, the performance prediction is sent to a decision block 680. At block 680 the performance prediction is compared to a performance limit 677. The performance limit 677 may be a worst case outcome that is acceptable. If the performance prediction is outside of the performance limit 677 (yes branch), then a predicted maintenance message 679 is generated. This is a flag that indicates a cleaning process is needed in the chamber. If the performance prediction is within the performance limit 677 (no branch), then the next wafer is processed at block 681.

After a predicted maintenance message 679 is generated, embodiments may include implementing a cleaning process in the chamber. In an embodiment, the cleaning process may be a waferless cleaning process. For example, cleaning gasses may be flown into the chamber in order to etch the coating on the chamber. The cleaning gasses may be dependent on the type of coating on the chamber. In a particular embodiment, the cleaning gas may include hydrogen ($H_2$) and oxygen ($O_2$). A pressure of the chamber may be provided at approximately 50 Torr or less. In a particular embodiment, the pressure may be approximately 10 Torr. The duration of the clean may be dependent on the thickness of the coating. For example, longer durations of the clean may be needed for thicker coatings. In a particular embodiment, the duration of the cleaning process may be approximately ten minutes or more.

Figure 7:
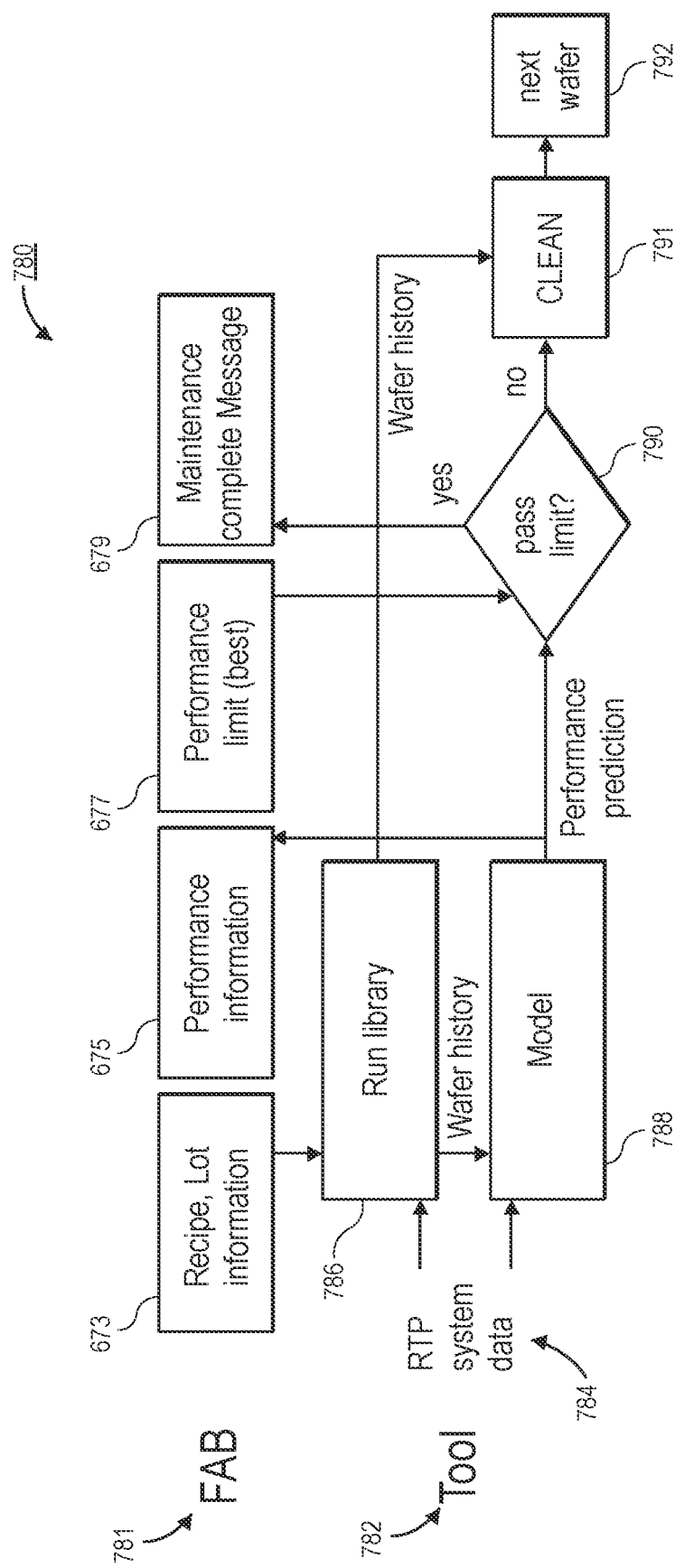
FIG. 7 is a process flow diagram of a process for identifying when a clean of an RTP tool is complete, in accordance with an embodiment.

In an embodiment, the model may also be used to monitor the cleaning process. For example, the model may be used in order to indicate when the cleaning process has sufficiently cleaned the chamber so that production substrates can be continued to run on the tool. An example, of the process for monitoring the chamber cleaning process is shown in FIG. 7.

Similar to the embodiment in FIG. 6, the process 780 may be implemented on both the FAB 781 server and locally on the tool 782. In other embodiments, the process 780 may be entirely executed on the tool 782. In an embodiment, the recipe and/or lot information 783 may be supplied to the tool 782. The recipe and/or lot information 783 may inform a run library 786. The run library 786 may include the substrate history (e.g., the processes implemented on the substrates, the metrology performed on the substrates, and the like). The run library 786 may supply wafer history to the model 788. The run library 786 and the model 788 may also have system data 784 inputs. The system data 784 may include sensor data from the tool 782. For example, the system data 784 may include a voltage value of one or more lamps in the chamber, a pyrometer reading of one or more pyrometers in the chamber, pumping data, and data from one or more witness sensors.

In an embodiment, the model 788 may be an AI or ML model. The model 788 may be substantially similar to the model 678 described in greater detail above. In an embodiment, the model 788 may be a digital twin in order to model performance of the tool 782.

In an embodiment, the model 788 may output a performance prediction. The performance prediction may be an estimated wafer outcome from implementing a process in the chamber, such as an oxidation process. In an embodiment, the performance prediction may be sent to a performance information block 785 in the FAB 781. Additionally, the performance prediction is sent to a decision block 790. At block 790 the performance prediction is compared to a performance limit 787. The performance limit 787 may be a best case outcome that indicates a clean chamber. If the performance prediction is within the performance limit 787 (yes branch), then a maintenance complete message 789 is generated, and the cleaning process is completed. If the performance prediction is outside of the performance limit 787 (no branch), then the clean 791 is continued before the next wafer 792 is processed.

Figure 8:
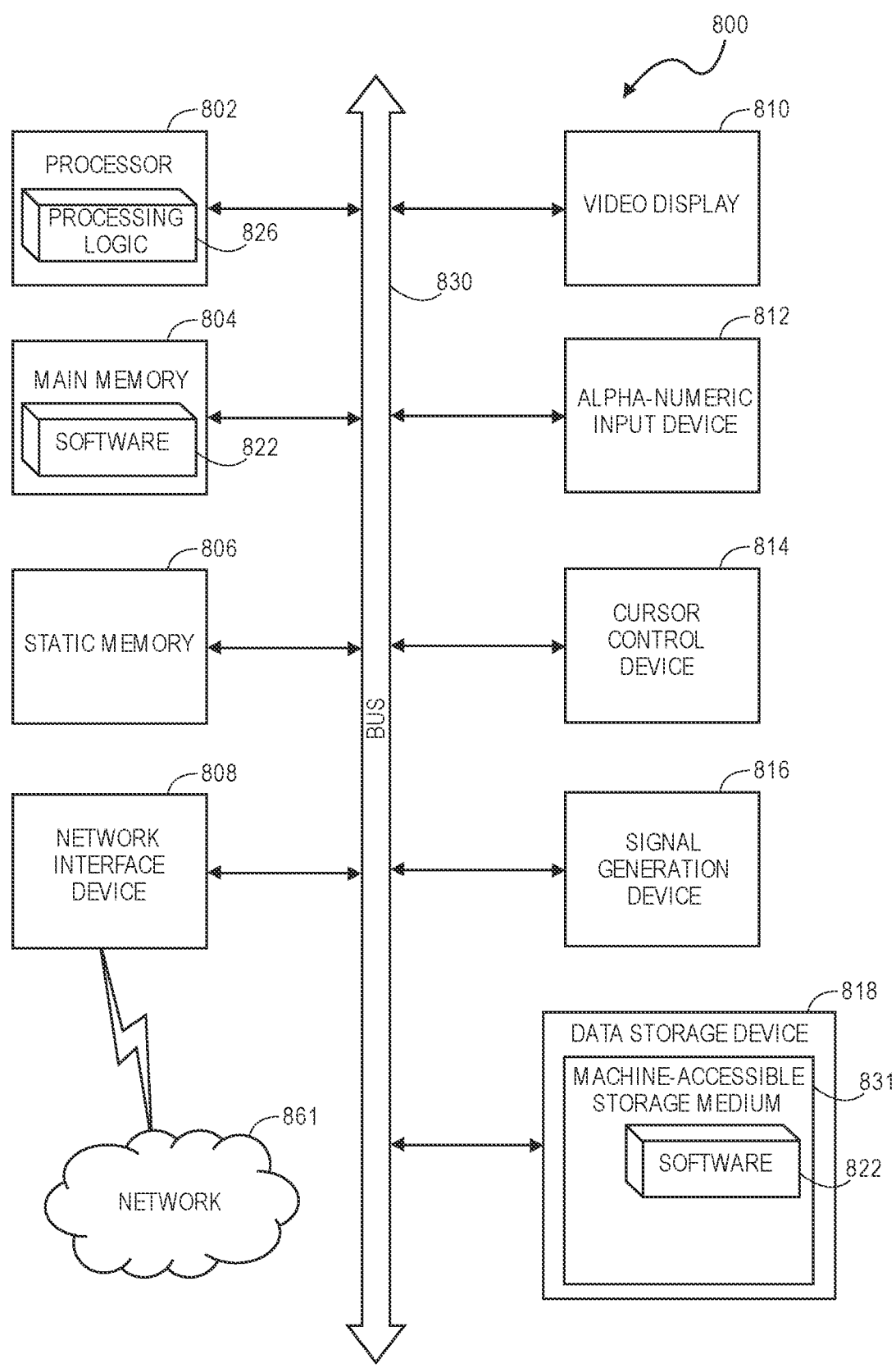
FIG. 8 illustrates a block diagram of an exemplary computer system that may be used in conjunction with a processing tool, in accordance with an embodiment.

Referring now to FIG. 8, a block diagram of an exemplary computer system 800 of a processing tool is illustrated in accordance with an embodiment. In an embodiment, computer system 800 is coupled to and controls processing in the processing tool. Computer system 800 may be connected (e.g., networked) to other machines in a Local Area Network (LAN), an intranet, an extranet, or the Internet. Computer system 800 may operate in the capacity of a server or a client machine in a client-server network environment, or as a peer machine in a peer-to-peer (or distributed) network environment. Computer system 800 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 800, the term "machine" shall also be taken to include any collection of machines (e.g., computers) that individually or jointly execute a set (or multiple sets) of instructions to perform any one or more of the methodologies described herein.

Computer system 800 may include a computer program product, or software 822, having a non-transitory machine-readable medium having stored thereon instructions, which may be used to program computer system 800 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 800 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic 826 for performing the operations described herein.

The computer system 800 may further include a system network interface device 808 for communicating with other devices or machines. The computer system 800 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 831 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 800, the main memory 804 and the system processor 802 also constituting machine-readable storage media. The software 822 may further be transmitted or received over a network 861 via the system network interface device 808. In an embodiment, the network interface device 808 may operate using RF coupling, optical coupling, acoustic coupling, or inductive coupling.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method of monitoring a condition of a chamber, comprising:
    processing a substrate in the chamber;
    providing substrate history and chamber data to a model of the chamber, wherein the model of the chamber is configured to predict a chamber cleanliness;
    comparing the predicted chamber cleanliness against a performance limit; and
    flagging the chamber for preventive maintenance (PM) when the predicted chamber cleanliness is above the performance limit.

2. The method of claim 1, wherein the substrate history includes a materials characterization of the surface of the substrate.

3. The method of claim 2, wherein the materials characterization includes an outgassing potential of the substrate.

4. The method of claim 1, wherein the chamber data comprises a voltage value for one or more lamps in the chamber.

5. The method of claim 1, wherein the chamber data comprises a pyrometer reading for one or more pyrometers in the chamber.

6. The method of claim 1, wherein the chamber data comprises pumping data.

7. The method of claim 1, wherein the chamber data comprises data from one or more witness sensors.

8. The method of claim 1, wherein the model of the chamber is a digital twin of the chamber.

9. The method of claim 1, wherein the chamber is part of a rapid thermal processing (RTP) tool.

10. The method of claim 1, wherein the PM includes a chamber cleaning operation.

11. The method of claim 10, wherein the chamber cleaning operation is a waferless chamber clean.

12. The method of claim 10, wherein the model of the chamber determines when the chamber cleaning operation is complete.

* * * * *